(12) United States Patent
Jang et al.

(10) Patent No.: US 11,078,599 B2
(45) Date of Patent: Aug. 3, 2021

(54) APPARATUS FOR PRODUCING AN INGOT COMPRISING A CRUCIBLE BODY WITH A LID ASSEMBLY HAVING A MOVABLE CORE MEMBER AND METHOD FOR PRODUCING SILICON CARBIDE INGOT USING THE APPARATUS

(71) Applicant: SKC Co., Ltd., Suwon-si (KR)

(72) Inventors: Byung Kyu Jang, Suwon-si (KR); Jung-Gyu Kim, Suwon-si (KR); Jung Woo Choi, Suwon-si (KR); Kap-Ryeol Ku, Suwon-si (KR); Sang Ki Ko, Suwon-si (KR)

(73) Assignee: SKC Co., Ltd., Suwon-si (KR)

( * ) Notice: Subject to any disclaimer, the term of this patent is extended or adjusted under 35 U.S.C. 154(b) by 8 days.

(21) Appl. No.: 16/555,583

(22) Filed: Aug. 29, 2019

(65) Prior Publication Data

US 2020/0190698 A1 Jun. 18, 2020

(30) Foreign Application Priority Data

Dec. 12, 2018 (KR) ........................ 10-2018-0159996

(51) Int. Cl.
*C30B 35/00* (2006.01)
*C30B 29/36* (2006.01)
*C30B 29/66* (2006.01)

(52) U.S. Cl.
CPC ............ *C30B 35/002* (2013.01); *C30B 29/36* (2013.01); *C30B 29/66* (2013.01); *C30B 35/007* (2013.01)

(58) Field of Classification Search
CPC ......... C30B 23/00; C30B 23/02; C30B 23/06; C30B 23/063; C30B 29/00; C30B 29/10; C30B 29/36; C30B 35/00; C30B 35/002; C30B 35/007

USPC .............. 117/84, 88, 98, 200, 204, 937, 951
See application file for complete search history.

(56) References Cited

U.S. PATENT DOCUMENTS

| | | | |
|---|---|---|---|
| 2002/0083892 A1 | 7/2002 | Kondo et al. | |
| 2009/0087645 A1* | 4/2009 | Mizuhara | C30B 29/403 428/332 |
| 2011/0214606 A1 | 9/2011 | Kondo | |
| 2013/0171402 A1* | 7/2013 | Straubinger | C30B 23/02 428/64.1 |

(Continued)

FOREIGN PATENT DOCUMENTS

| | | |
|---|---|---|
| CN | 102605421 A | 7/2012 |
| CN | 103173863 A | 6/2013 |

(Continued)

OTHER PUBLICATIONS

Chinese Office Action dated Apr. 9, 2021 in counterpart Chinese Patent Application No. 201910643497.1 (9 pages in Chinese).

*Primary Examiner* — Kenneth A Bratland, Jr.
(74) *Attorney, Agent, or Firm* — NSIP Law (57) ABSTRACT

An apparatus for producing an ingot includes a crucible body having an opening and in which raw materials are accommodated, and a lid assembly located at the opening and having a portion fixed to the crucible body. The lid assembly includes a placement hole having open upper and lower ends, a frame member arranged along a periphery of the opening while surrounding a periphery of the placement hole, and a core member located in the placement hole and movable upward and downward with respect to the frame member.

17 Claims, 5 Drawing Sheets

(56) References Cited

U.S. PATENT DOCUMENTS

2014/0220298 A1\* 8/2014 Loboda ................ C30B 23/025
                                                                                428/141

FOREIGN PATENT DOCUMENTS

| | | |
|---|---|---|
| CN | 103603037 A | 2/2014 |
| CN | 104937148 A | 9/2015 |
| CN | 106232877 A | 12/2016 |
| CN | 106716596 A | 5/2017 |
| DE | 10 2012 222 841 A1 | 7/2013 |
| DE | 10 2012 222 843 A1 | 7/2013 |
| EP | 2 653 591 A1 | 10/2013 |
| JP | 3-295898 A | 12/1991 |
| JP | 2001-114599 A | 4/2001 |
| JP | 2002-255693 A | 9/2002 |
| JP | 2009-91186 A | 4/2009 |
| JP | 2009091186 A \* | 4/2009 |
| JP | 4547031 B2 | 9/2010 |
| JP | 2011-190129 A | 9/2011 |
| JP | 2011-251884 A | 12/2011 |
| JP | 4962186 B2 | 6/2012 |
| JP | 2012-240906 A | 12/2012 |
| JP | 2012240906 A \* | 12/2012 |
| JP | 2013-529175 A | 7/2013 |
| JP | 5397503 B2 | 1/2014 |
| JP | 5613619 B2 | 10/2014 |
| JP | 2015-229608 A | 12/2015 |
| JP | 2017-105676 A | 6/2017 |
| KR | 10-0675912 B1 | 2/2007 |
| KR | 10-2012-0119365 A | 10/2012 |
| WO | WO 02/053813 A1 | 7/2002 |
| WO | WO 2007/080881 A1 | 7/2007 |
| WO | WO 2012/079439 A1 | 6/2012 |
| WO | WO 2016/076664 A1 | 5/2016 |

\* cited by examiner

APPARATUS FOR PRODUCING AN INGOT COMPRISING A CRUCIBLE BODY WITH A LID ASSEMBLY HAVING A MOVABLE CORE MEMBER AND METHOD FOR PRODUCING SILICON CARBIDE INGOT USING THE APPARATUS

CROSS-REFERENCE TO RELATED APPLICATION

This application claims the benefit under 35 U.S.C. 119(a) of Korean Patent Application No. 10-2018-0159996 filed on Dec. 12, 2018, in the Korean Intellectual Property Office, the entire disclosure of which is incorporated herein by reference for all purposes.

BACKGROUND

1. Field

The present disclosure relates to an apparatus for producing an ingot and a method for producing a silicon carbide ingot using the apparatus.

2. Description of the Background

Single crystals of silicon carbide (SiC), silicon (Si), gallium nitride (GaN), sapphire ($Al_2O_3$), gallium arsenide (GaAs), aluminum nitride (AlN), etc. exhibit unexpected properties different from those of their polycrystals. Thus, there is an increasing demand for these single crystals in industrial fields.

Single-crystal silicon carbide (SiC) has a large energy band gap and its break field voltage and thermal conductivity are higher than those of silicon (Si). The carrier mobility of single-crystal silicon carbide is comparable to that of silicon, and the electron saturation drift velocity and breakdown voltage of single-crystal silicon carbide are also high. Due to these characteristics, single-crystal silicon carbide is expected to be applicable to semiconductor devices where high efficiency, high breakdown voltage, and large capacity are needed.

Many methods for producing single crystals are known. For example, Japanese Patent Publication No. 2001-114599 discloses a method for growing a single-crystal ingot on a seed crystal by heating with a heater in a vacuum container (furnace) into which argon gas can be introduced while maintaining the temperature of the seed crystal at a temperature lower by 10 to 100° C. than the temperature of a raw material powder.

Attempts have been made to produce large-diameter single-crystal ingots substantially free of defects. For example, a method for growing a single-crystal ingot from a seed crystal attached to a holder of a crucible with an adhesive is efficient compared to conventional methods but needs to be improved because poor adhesive strength between the silicon carbide seed crystal and the holder and many fine pores formed at the interface limit the growth of high-quality large-diameter silicon carbide single-crystal ingots.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for producing an ingot includes a crucible body having an opening and in which raw materials are accommodated, and a lid assembly located at the opening and having a portion fixed to the crucible body, wherein the lid assembly includes a placement hole having open upper and lower ends, a frame member arranged along a periphery of the opening while surrounding a periphery of the placement hole, and a core member located in the placement hole and movable upward and downward with respect to the frame member.

An outer peripheral diameter of the core member may be less than a peripheral diameter of the placement hole.

The apparatus may further include a seed crystal fixing unit located at a top end of the crucible body or between the crucible body and the lid assembly and including a seed crystal.

The seed crystal fixing unit and the core member may meet each other at one or more points.

The upward and downward movements of the core member may eliminate or relieve compressive stress caused by warpage of the seed crystal fixing unit that is generated by rising temperature of the crucible body or its inner part.

An outer periphery of a lower surface of the core member may be spaced apart from the periphery of the placement hole by a predetermined gap.

The gap may be 10 µm or more.

The seed crystal fixing unit may include i) the seed crystal disposed on a front surface thereof and from which an ingot is grown, and ii) a seed crystal holder in direct contact with a rear surface of the seed crystal and adapted to fix the seed crystal.

An outer peripheral diameter of the core member may be 0.7 to 1.2 times greater than a diameter of the seed crystal.

The core member may include a plate made of graphite.

The frame member may include a frame body having a predetermined thickness located on an upper end of the opening of the crucible body and an extension connected to the frame body and in contact with an inner periphery of the opening of the crucible body.

The core member may have a vertical center as an imaginary line passing vertically through a center of the core member and may be circular or toroidal in cross section when viewed from a plane perpendicular to the vertical center.

The core member may have a vertical center as an imaginary line passing vertically through a center of the core member and a horizontal center as an imaginary line perpendicular to the vertical center and dividing the core member into upper and lower portions, and the outer peripheral diameter of one or both of the upper and lower portions gradually decreases toward the corresponding end of the vertical center.

A method for producing a single-crystal ingot using the apparatus may include set-up step and growth step wherein the set-up step has loading the crucible body with raw materials, arranging a seed crystal such that a surface of the seed crystal faces the raw materials, and locating the lid assembly on the opening to set up the apparatus, and wherein the growth step has applying suitable temperature and pressure conditions to the apparatus to grow an ingot from the seed crystal.

In the set-up step, the seed crystal may be fixedly arranged on a seed crystal holder and a lower end of the core member may be brought into contact with an upper end of the seed crystal holder at one or more points, and in the growth step, i) the core member may remove or relieve thermal stress applied to the seed crystal holder, and ii) the core member may move upward or downward to remove or relieve compressive stress applied to the seed crystal holder such that an ingot is grown from the seed crystal.

In the set-up step, the seed crystal may be fixedly arranged on a seed crystal holder, a lower end of the core member may be brought into contact with an upper end of the seed crystal holder at one or more points, and an outer periphery of a lower surface of the core member may be spaced apart from the periphery of the placement hole by a predetermined gap.

In the growth step, thermal insulation layers formed between an upper surface of a seed crystal fixing unit and the lower surface of the core member may be removed by releasing heat from the crucible to the outside through the gap.

The raw materials may include carbon and silicon and the ingot may be a silicon carbide single-crystal ingot whose surface is convex or flat.

The seed crystal may have a diameter of 4 inches or more.

In another general aspect, an apparatus for producing an ingot includes a crucible, a lid assembly disposed on the crucible, wherein the lid assembly includes a placement hole, and a core member disposed in the placement hole to move up to increase volume in the crucible and move down to decrease volume in the crucible.

The apparatus may further include a seed crystal fixing unit disposed in the crucible in contact with the core member.

A method of producing a single-crystal ingot using the apparatus may include disposing raw material in the crucible, fixing a seed crystal to the seed crystal fixing unit to face the raw material, and applying temperature and pressure to grow an ingot from the seed crystal, wherein the core member may move up and down in the placement hole in response to one or more of the applying temperature and pressure and the growing of the ingot.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

In the present specification, the phrase that a certain element "comprises" or "includes" another element means that the certain element may further include one or more other elements but does not preclude the presence or addition of one or more other elements, unless stated to the contrary.

The term "combination of" included in Markush type description means mixture or combination of one or more elements described in Markush type and thereby means that the disclosure includes one or more elements selected from the Markush group.

An aspect of the present disclosure is to provide an apparatus for producing a large-diameter single-crystal ingot with fewer defects and a method for producing a silicon carbide single-crystal ingot using the apparatus. For example, the density of the surface pits of a silicon carbide single-crystal ingot prepared through the above apparatus or method may be 10,000 ea/cm² or less.

Figure 1:
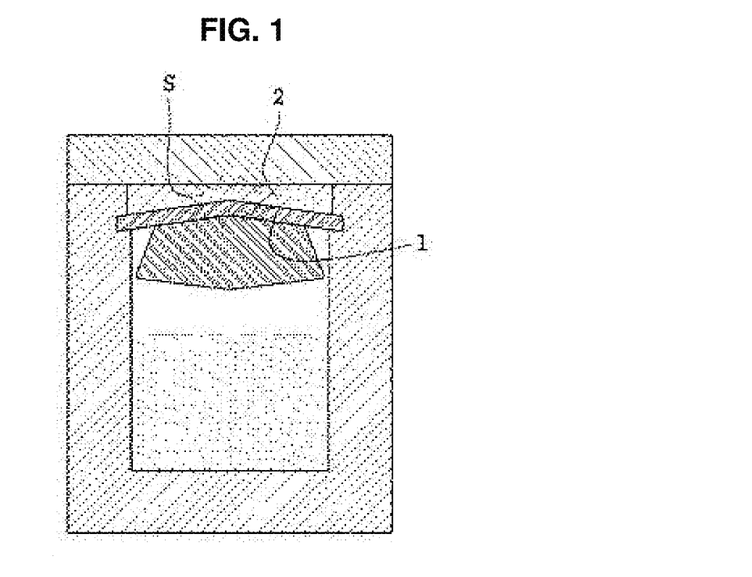
FIG. 1 is a schematic view illustrating an apparatus for producing an ingot according to one or more examples.
Figure 2:
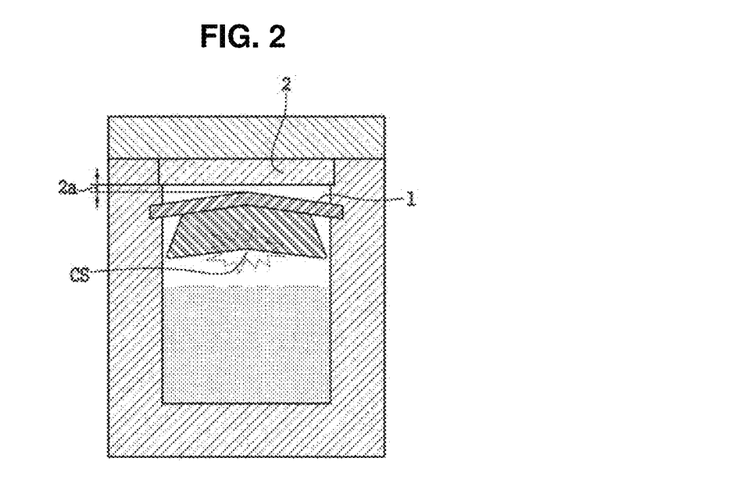
FIG. 2 is a schematic view illustrating an apparatus for producing an ingot according to one or more other examples.
Figure 8:
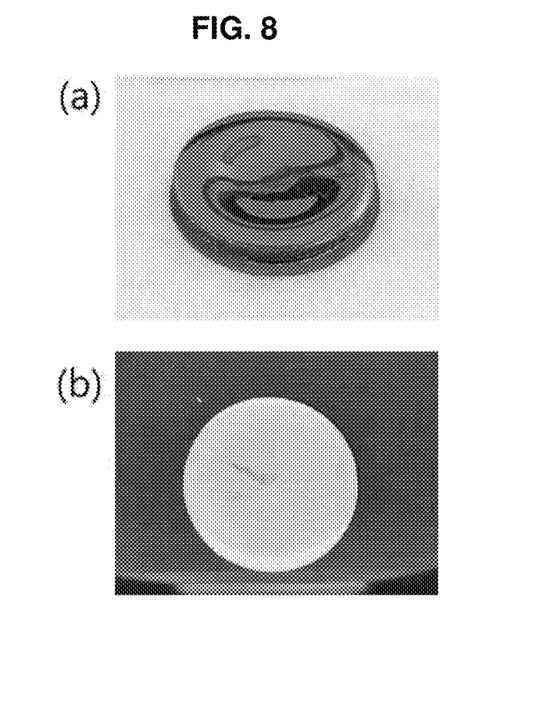
FIG. 8 shows (a) a real image and (b) a UV image of a silicon carbide ingot produced using the crucible having the structure of FIG. 2.

The inventors of the claimed invention have studied a method for growing a larger-diameter single-crystal ingot with fewer defects, and as a result, found that when a crucible is constructed such that a seed crystal holder 1 is in direct contact with a lid 2 closing the entrance of the crucible, as illustrated in FIG. 1, an ingot is warped convexly toward the seed crystal holder due to a difference in coefficient of thermal expansion between a seed crystal and the seed crystal holder and the seed crystal holder 1 pushes the lid 2 to generate compressive stress (S) in the ingot, which is a cause of cracking in the grown ingot. Based on this discovery, the inventors have attempted to grow an ingot using a crucible set up such that a seed crystal is spaced a distance from a lid (see FIG. 2). However, the central portion of the ingot was observed to be concave (CS) (see the image of FIG. 8). Incorporation of polytypes into the ingot and quality deterioration of the ingot were observed.

As a surprising solution to these problems, the inventors discovered a crucible lid assembly having a structure in which a central portion of a lid can move upward and downward, which will be described below.

Figure 3:
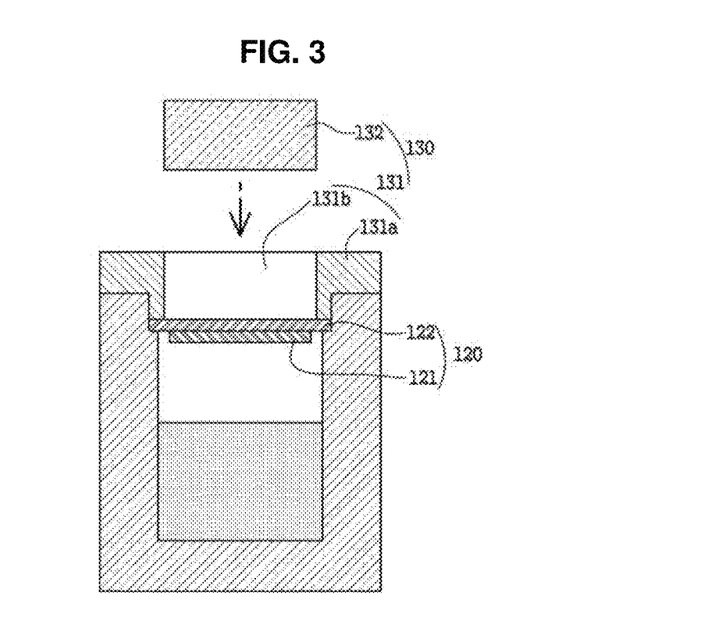
FIG. 3 is a schematic view illustrating the setting up of an apparatus for producing an ingot according to one or more examples.
Figure 4:
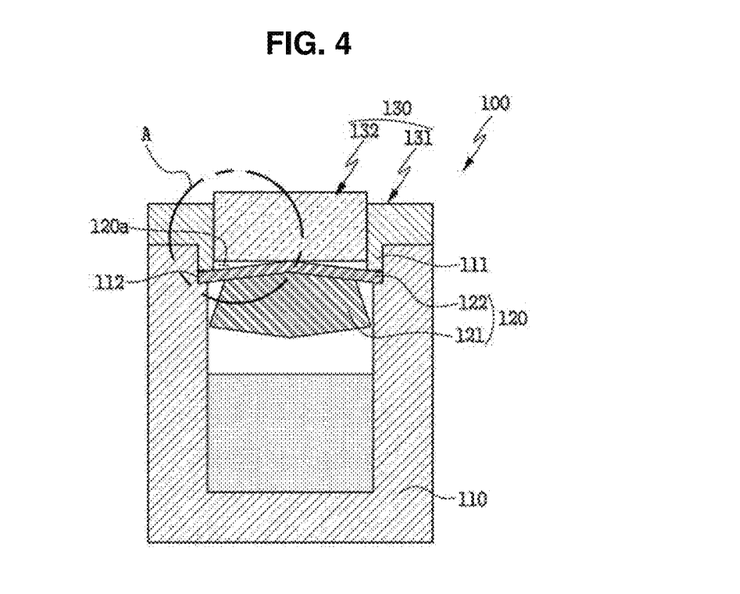
FIG. 4 is a schematic view illustrating an apparatus for producing an ingot according to one or more examples.
Figure 5:
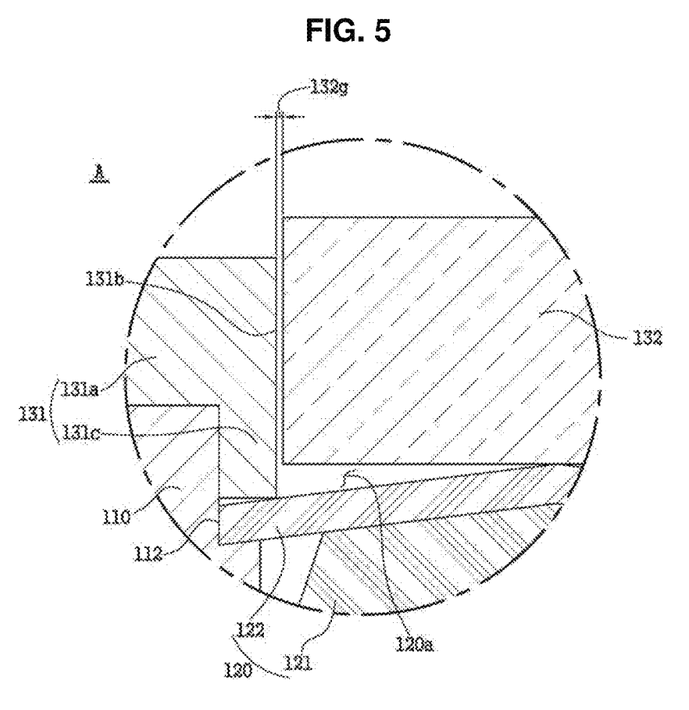
FIG. 5 is an enlarged view of circle "A" of FIG. 4.
Figure 6:
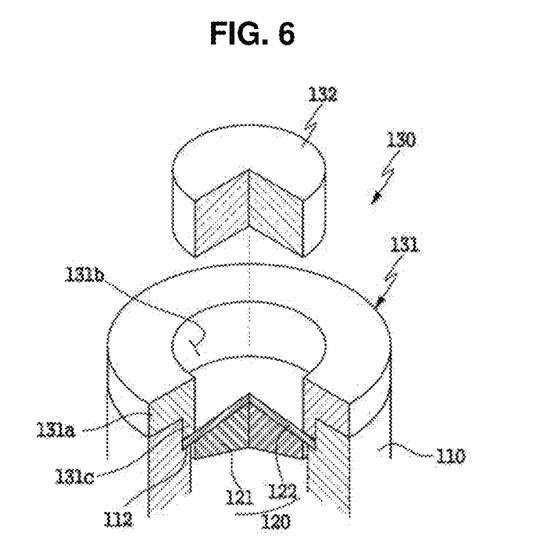
FIG. 6 is an exploded perspective view illustrating the lid assembly of the apparatus of FIG. 4.

FIGS. 3 and 4 schematically illustrate a process for setting up an apparatus for producing an ingot according to one or more examples, FIG. 5 is an enlarged view of circle "A" of FIG. 4, and FIG. 6 is an exploded perspective view illustrating the lid assembly of the apparatus of FIG. 4. One or more examples of the apparatus will be described in more detail with reference to FIGS. 3 to 6.

The apparatus 100 includes a crucible body 110 having an opening 111 and in which raw materials are accommodated, and a lid assembly 130 located at the opening 111 and having at least a portion fixed to the crucible body 110.

The crucible body 110 has an internal space into which raw materials are loaded. The opening 111 is formed at an upper end of the crucible body 110. The raw materials enter and exit through the opening 111. A seed crystal fixing unit 120 may be located in the opening 111 or at the upper end of the crucible body 110. Alternatively, the seed crystal fixing unit 120 may be located at a position close to the opening.

The internal space of the crucible body 110 is opened through the opening 111. The crucible body 110 may have an insertion fixing portion 112 into which the seed crystal fixing unit 120 is insertable. Specifically, the insertion fixing portion 112 may be formed at the end of the crucible body located along the periphery of the opening 111 and having an inner diameter larger than the inner diameter of the lower end of the crucible body 110 where the raw materials are located. For example, the insertion fixing portion 112 may be in the form of a stepped portion.

The lid assembly 130 includes a placement hole 131b having open upper and lower ends, a frame member 131 arranged along the periphery of the opening 111 while surrounding the periphery of the placement hole 131b, and a core member 132 located in the placement hole 131b and movable upward and downward with respect to the frame member 131.

The outer peripheral diameter of the core member 132 may be designed to be smaller than the peripheral diameter of the placement hole 131b. For example, the outer peripheral diameter of the core member 132 may be different by at least 10 μm, 10 to 10,000 μm or 50 to 1,000 μm from the peripheral diameter of the placement hole 131b.

The seed crystal fixing unit 120 of the apparatus 100 may be located at the top end of the crucible body 110 or between the crucible body 110 and the lid assembly 130 and may include a seed crystal 121.

The seed crystal fixing unit 120 and the core member 132 may meet each other at one or more points.

The seed crystal fixing unit 120 may include i) a seed crystal 121 disposed on the front surface thereof and ii) a seed crystal holder 122 in direct contact with the rear surface of the seed crystal 121 and adapted to fix the seed crystal 121. That is, the apparatus 100 may further include a seed crystal holder 122 located at the top end of the crucible body 110 or between the crucible body 110 and the lid assembly 130 and whose one surface is fixed with the seed crystal 121. Here, the other surface of the seed crystal holder 122 meets the core member 132 at the one or more points.

Alternatively, the seed crystal fixing unit 120 may include i) a seed crystal 121 having one surface on which an ingot is grown and ii) a protective film (not illustrated) in direct contact with and protecting the rear surface of the seed crystal 121. The core member 132 and the protective film may meet each other at one or more points.

The upward and downward movements of the core member 132 eliminate or relieve compressive stress caused by warpage of the seed crystal fixing unit 120 that is generated by rising temperature of the crucible body 110 or its inner part.

The core member 132 eliminates or relieves thermal stress between the seed crystal fixing unit 120 and the lid assembly 130 that may be generated by rising temperature of the crucible body 110 or its inner part. For example, the core member 132 serves to release excess heat from the seed crystal fixing unit 120 due to its direct contact with the seed crystal fixing unit 120.

The core member 132 can directly induce heat release through a space 120a present between the seed crystal fixing unit 120, the core member 132 and the frame member 131 or a gap 132g present between the core member 132 and the frame member 131 to eliminate the formation of thermal insulation layers.

The outer periphery of the lower surface of the core member 132 may be spaced apart from the periphery of the placement hole 131b at the gap 132g.

The gap 132g may be 10 μm or more, 10 to 10,000 μm, 50 to 5,000 μm or 60 to 200 μm. The gap 132g formed between the core member 132 and a frame body 131a allows the lid assembly 130 to sufficiently act as a crucible lid and can help heat release and stable ingot growth.

The outer peripheral diameter of the core member 132 may be 0.7 to 1.2 times or 0.9 to 1.15 times greater than the diameter of the seed crystal 121. With these dimensions, an ingot with fewer defects can be grown from the seed crystal.

The crucible body 110 and the frame member 131 may be made of any material for crucibles that are used to grow ingots. For example, the crucible body 110 and the frame member 131 may be made of graphite.

The core member 132 may be made of the same material for the frame member 131. Alternatively, the core member 132 may be made of a material whose coefficient of thermal expansion is the same as or lower than that of a material for the frame member 131. For example, the core member 132 may be a plate made of graphite.

The ratio of the thickness of the core member 132 to the thickness of the frame member 131 may be from 0.4:1 to 2.5:1. If the thickness ratio is <0.4:1, the core member 132 may even act as a heater, and as a result, the temperature of the seed crystal 121 (i.e. the seed part) may increase, leading to the growth of an ingot having a small thickness. Meanwhile, if the thickness ratio is >2.5:1, the temperature of the seed crystal 121 (i.e. the seed part) may decrease, leading to the growth of an ingot whose surface is flat or concave.

The frame body 131a of the frame member 131 is located on the upper end of the opening 111 of the crucible body and has a predetermined thickness. The frame member 131 may include an extension 131c connected to the frame body 131a and in contact with the inner periphery of the opening of the crucible body 110.

The extension 131c surrounds the inner surface of the opening formed at the upper end of the crucible body 110, has a predetermined thickness, and is helpful to stably locate the frame body 131a on the crucible body 110.

One end of the extension 131c may pressurize at least a portion of the upper surface of the seed crystal fixing unit 120. This arrangement ensures more stable support of the seed crystal fixing unit 120 under high temperature and low pressure conditions. For example, the one end of the extension 131c is in direct contact with and supports or pressurizes the edge portion of the seed crystal fixing unit 120. Specifically, one end of the extension 131c is in direct contact with and supports or pressurizes the edge portion of the seed crystal holder 122.

Figure 7:
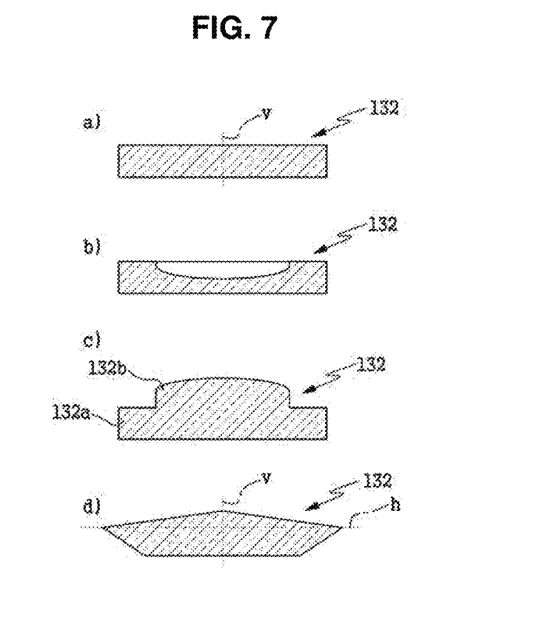
FIG. 7 schematically illustrates example shapes of the core member of the apparatus of FIG. 3.

An explanation will be given concerning the shape of the core member 132.

The core member 132 may have a vertical center (v) as an imaginary line passing vertically through the center of the core member and may be circular or toroidal in cross section when viewed from a plane perpendicular to the vertical center.

Alternatively, the core member 132 may have a vertical center (v) as an imaginary line passing vertically through the center of the core member and a horizontal center (h) as an imaginary line perpendicular to the vertical center (v) and dividing the core member into upper and lower portions.

The core member 132 may have a shape in which the outer peripheral diameter of one or both of the upper and lower portions gradually decreases toward the corresponding end of the vertical center. Due to this shape, the core member is moved in conjunction with the lid assembly to more easily release heat, etc.

For example, the core member 132 may be cylindrical with a vertical center (v) (see (a) of FIG. 7). Here, the outer peripheral diameters of the upper and lower surfaces of the core member 132 may be the same with respect to the vertical center (v).

For example, the core member 132 may be a cylindrical plate in which a central portion of the upper surface is depressed toward the lower surface (see (b) of FIG. 7).

For example, the core member 132 may be arranged along the placement hole 131b and may include a core body 132a whose lower surface is in contact with the seed crystal fixing unit 120 and a protrusion 132b protruding from the upper surface of the core body 132a. The diameter of the protrusion 132b may be designed to be smaller than that of the core body 132a (see (c) of FIG. 7).

For example, the core member 132 may have a horizontal center (h) and a vertical center (v) perpendicularly connected to each other. The core member 132 is divided into upper and lower portions with respect to the horizontal center (h) such that it has a shape in which the outer peripheral diameter of one or both of the upper and lower portions gradually decreases toward the corresponding end of the vertical center. For example, when viewed from a cross section cut along the vertical center (v), the upper portion may have a triangular cross section and the lower portion may have a trapezoid, rhombic or rectangular cross section (see (d) of FIG. 7).

For example, the difference in height between the center and edge of the upper portion of the core member 132 may be 0-60% less than the total thickness of the core member. For example, the upper portion may have a triangular, semicircular or trapezoidal shape in cross section with respect to the vertical center. This shape enables more effective control over stress caused by heat ascending from inside the crucible.

The apparatus 100 may be used to produce a silicon carbide single-crystal ingot. In this case, the apparatus may be loaded with carbon and silicon as raw materials or crystalline or amorphous silicon carbide as a raw material.

The apparatus 100 may also be used to produce a large-diameter ingot. For example, the use of the apparatus enables the production of a silicon carbide single-crystal ingot having a diameter of 4 inches or more, 6 inches or more or, for example, 4 to 16 inches.

To produce a silicon carbide ingot, the seed crystal may be, for example, 4H—SiC single-crystal wafer, 6H—SiC single-crystal wafer, 3C—SiC single-crystal wafer or 15R—SiC single-crystal wafer.

The use of the apparatus 100 enables the production of a large-diameter silicon carbide single-crystal ingot whose size corresponds to 70% or more of the outer diameter of the crucible body. In addition, the use of the apparatus 100 is advantageous in that the shape of an ingot to be grown can be controlled by varying the thickness or shape of the plate.

A method for producing a single-crystal ingot using the apparatus according to one or more further examples described herein includes set-up and growth steps.

In the set-up step, the crucible body 110 is loaded with raw materials, the seed crystal 121 is arranged such that one surface of the seed crystal faces the raw materials, and the lid assembly 130 is disposed on the opening to set up the apparatus.

In the set-up step, the seed crystal 121 is fixedly arranged on the seed crystal holder 122 and the lower end of the core member 132 is brought into contact with the upper end of the seed crystal holder 122 at one or more points.

For example, in the set-up step, the seed crystal 121 may be fixedly arranged on the seed crystal holder 122, the lower end of the core member 132 may be brought into contact with the upper end of the seed crystal holder 122 at one or more points, and the outer periphery of the lower surface of the core member 132 may be spaced apart from the periphery of the placement hole 131b by a predetermined gap 132g.

In the growth step, suitable temperature and pressure conditions are applied to the apparatus to grow an ingot from the seed crystal 121.

In the growth step, the raw materials may be grown at a temperature of, for example, 2,000 to 2,500° C. and a pressure of, for example, 1 to 200 torr.

In the growth step, i) the core member 132 may remove or relieve thermal stress applied to the seed crystal holder 122 such that an ingot is grown.

In the growth step, ii) the core member 132 may move upward or downward to remove or relieve compressive stress applied to the seed crystal holder 122 such that an ingot is grown from the seed crystal 121.

In the growth step, thermal insulation layers formed between the upper surface of the seed crystal fixing unit 120 and the lower surface of the core member 132 may be removed by releasing heat from the crucible to the outside through the gap 132g.

Figure 9:
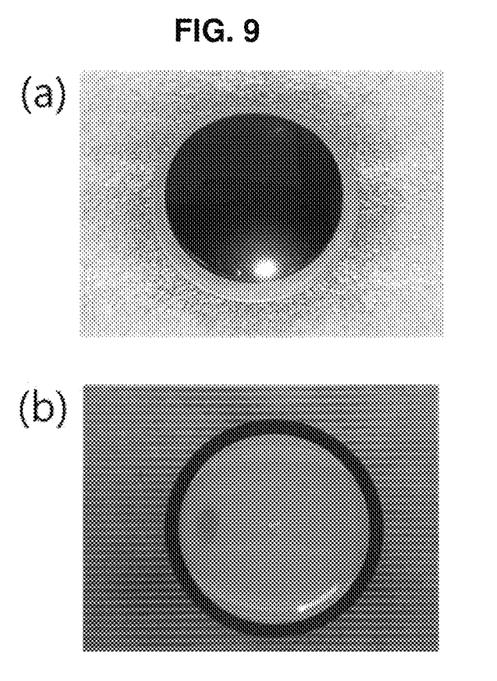
FIG. 9 shows (a) a real image and (b) a UV image of a silicon carbide ingot produced using the crucible having the structure of FIG. 3.

The use of the lid assembly 130 for ingot production facilitates the release of heat from the seed crystal fixing unit 120, particularly the seed crystal holder 122, and the removal of compressive stress caused by warpage of the seed crystal fixing unit 120 that is generated upon expansion of the materials, to induce ingot growth. In addition, the method enables the production of a high-quality large-diameter single-crystal ingot. Particularly, the method enables the growth of a high-quality ingot whose surface is convex or flat (see the images of FIG. 9).

The constitution and construction of the apparatus, the ingot, the raw materials, the seed crystal, etc. are the same as those described in the previous examples and a further detailed description thereof is omitted to avoid duplication.

The apparatus and method of the disclosure presented in the examples described herein, enable effective control over mechanical forces such as compressive stress and thermal stress that are possibly applied to the seed crystal during ingot growth. Therefore, the apparatus and method of the examples described herein can be used to effectively produce a single-crystal ingot with fewer defects over a large area.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for producing an ingot, comprising:
   a crucible body comprising an opening and in which raw materials are accommodated;
   a lid assembly located at the opening and comprising a portion fixed to the crucible body; and
   a seed crystal fixing unit located at a top end of the crucible body or between the crucible body and the lid assembly and comprising a seed crystal,
   wherein the lid assembly comprises:
   a placement hole comprising open upper and lower ends;
   a frame member arranged along a periphery of the opening while surrounding a periphery of the placement hole; and
   a core member located in the placement hole and movable upward and downward with respect to the frame member,
   wherein the seed crystal fixing unit and the core member meet each other at one or more points and a space is present between the seed crystal fixing unit and the core member, and wherein an outer periphery of a lower surface of the core member is spaced apart from the periphery of the placement hole by a predetermined gap.

2. The apparatus according to claim 1, wherein an outer peripheral diameter of the core member is less than a peripheral diameter of the placement hole.

3. The apparatus according to claim 1, wherein the upward and downward movements of the core member eliminate or relieve compressive stress caused by warpage of the seed crystal fixing unit that is generated by rising temperature of the crucible body or its inner part.

4. The apparatus according to claim 1, wherein the gap is 10 μm or more.

5. The apparatus according to claim 1, wherein the seed crystal fixing unit comprises i) the seed crystal disposed on a front surface thereof and from which an ingot is grown, and ii) a seed crystal holder in direct contact with a rear surface of the seed crystal and adapted to fix the seed crystal.

6. The apparatus according to claim 1, wherein an outer peripheral diameter of the core member is 0.7 to 1.2 times greater than a diameter of the seed crystal.

7. The apparatus according to claim 1, wherein the core member comprises a plate made of graphite.

8. The apparatus according to claim 1, wherein the frame member comprises a frame body having a predetermined thickness located on an upper end of the opening of the crucible body and an extension connected to the frame body and in contact with an inner periphery of the opening of the crucible body.

9. The apparatus according to claim 1, wherein the core member comprises a vertical center as an imaginary line passing vertically through a center of the core member and is circular or toroidal in cross section when viewed from a plane perpendicular to the vertical center.

10. The apparatus according to claim 1, wherein the core member comprises a vertical center as an imaginary line passing vertically through a center of the core member and a horizontal center as an imaginary line perpendicular to the vertical center and dividing the core member into upper and lower portions, and the outer peripheral diameter of one or both of the upper and lower portions gradually decreases toward the corresponding end of the vertical center.

11. A method for producing a single-crystal ingot using the apparatus according to claim 1, the method comprising:
loading the crucible body with the raw materials, arranging a seed crystal such that a surface of the seed crystal faces the raw materials, and locating the lid assembly on the opening to set up the apparatus; and
applying suitable temperature and pressure conditions to the apparatus to grow an ingot from the seed crystal.

12. The method according to claim 11, wherein:
in the set-up step, the seed crystal is fixedly arranged on a seed crystal holder and a lower end of the core member is brought into contact with an upper end of the seed crystal holder at one or more points; and
in the growth step, i) the core member removes or relieves thermal stress applied to the seed crystal holder, and ii) the core member moves upward or downward to remove or relieve compressive stress applied to the seed crystal holder such that an ingot is grown from the seed crystal.

13. The method according to claim 11, wherein:
in the set-up step, the seed crystal is fixedly arranged on a seed crystal holder, a lower end of the core member is brought into contact with an upper end of the seed crystal holder at one or more points, and an outer periphery of a lower surface of the core member is spaced apart from the periphery of the placement hole by a predetermined gap; and
in the growth step, thermal insulation layers formed between an upper surface of a seed crystal fixing unit and the lower surface of the core member are removed by releasing heat from the crucible to the outside through the gap.

14. The method according to claim 11, wherein the raw materials comprise carbon and silicon and the ingot is a silicon carbide single-crystal ingot whose surface is convex or flat.

15. The method according to claim 11, wherein the seed crystal comprises a diameter of 4 inches or more.

16. An apparatus for producing an ingot, comprising:
a crucible comprising an opening and in which raw materials are accommodated;
a lid assembly disposed on the crucible, wherein the lid assembly comprises:
a placement hole;
a core member disposed in the placement hole to move up to increase volume in the crucible and move down to decrease volume in the crucible;
a seed crystal fixing unit disposed in the crucible in contact with the core member;
a space disposed between the core member and the seed crystal fixing unit; and
a frame member arranged along a periphery of the opening while surrounding a periphery of the placement hole,
wherein the seed crystal fixing unit and the core member meet each other at one or more points, and
wherein an outer periphery of a lower surface of the core member is spaced apart from the periphery of the placement hole by a predetermined gap.

17. A method of producing a single-crystal ingot using the apparatus according to claim 16, the method comprising:
disposing raw material in the crucible;
fixing a seed crystal to the seed crystal fixing unit to face the raw material; and
applying temperature and pressure to grow an ingot from the seed crystal, wherein the core member moves up and down in the placement hole in response to one or more of the applying temperature and pressure and the growing of the ingot.

* * * * *